US007333338B2

(12) United States Patent
Lai et al.

(10) Patent No.: US 7,333,338 B2
(45) Date of Patent: Feb. 19, 2008

(54) MEMORY MODULE ASSEMBLY INCLUDING A CLIP FOR MOUNTING A HEAT SINK THEREON

(75) Inventors: Cheng-Tien Lai, Guangdong (CN); Zhi-Yong Zhou, Guangdong (CN); Qiao-Li Ding, Guangdong (CN)

(73) Assignees: Fu Zhun Precison Industry (Shen Zhen) Co., Ltd., Shenzhen, Guangdong Province (TW); Foxconn Technology Co., Ltd., Tu-Cheng, Taipei Hsien (TW)

( * ) Notice: Subject to any disclaimer, the term of this patent is extended or adjusted under 35 U.S.C. 154(b) by 65 days.

(21) Appl. No.: 11/308,073

(22) Filed: Mar. 5, 2006

(65) Prior Publication Data

US 2007/0206359 A1 Sep. 6, 2007

(51) Int. Cl.
*H05K 7/20* (2006.01)

(52) U.S. Cl. ...................... 361/715; 361/704; 361/719; 361/720; 165/80.3; 165/185; 257/718; 257/719

(58) Field of Classification Search ........ 361/700–712, 361/714, 715, 717, 719, 727, 728, 753, 794, 361/816, 818; 174/16.3, 15.1, 50 G, 50 R; 24/453, 457, 458, 625, 588, 589; 29/890.02, 29/890.03, 515, 832; 257/718–727; 165/80.2, 165/80.3, 185

See application file for complete search history.

(56) References Cited

U.S. PATENT DOCUMENTS 5,331,507 A * 7/1994 Kyung et al. ............... 361/720
5,615,735 A * 4/1997 Yoshida et al. ............ 165/80.3
6,343,020 B1 1/2002 Lin et al.
6,424,530 B1 * 7/2002 Lee et al. .................. 361/704
6,510,054 B1 * 1/2003 Chen .......................... 361/704
6,518,507 B1 * 2/2003 Chen .......................... 174/252
6,644,387 B1 * 11/2003 Lee et al. ................. 165/80.3

* cited by examiner

*Primary Examiner*—Michael Datskovskiy
(74) *Attorney, Agent, or Firm*—Winston Hsu

(57) ABSTRACT

A memory module assembly (1) includes a printed circuit board (10) having an electronic heat-generating electronic component (40) thereon, a heat sink (20) and a clip (30) for securing the heat sink onto the heat-generating electronic component. The clip includes a pressing portion (32) and a pair of latching portions (33) respectively extending from two ends of the pressing portion. Each latching portion includes a latching leg (332) and a retaining hook section (334) formed at a bottom end of the latching leg. The retaining hook sections tightly engage a bottom face of the printed circuit board and the pressing portion presses the base toward the heat-generating electronic component. The latching legs extend through an opening and a through hole in the printed circuit board. The through hole has a L-shaped configuration and does not communicate with a periphery side of the printed circuit board.

19 Claims, 4 Drawing Sheets

MEMORY MODULE ASSEMBLY INCLUDING A CLIP FOR MOUNTING A HEAT SINK THEREON

FIELD OF THE INVENTION

The present invention relates generally to a memory module assembly, and more particularly to a memory module assembly including a clip for mounting a heat sink to an electronic component attached on a surface of a printed circuit board of the memory module assembly.

DESCRIPTION OF RELATED ART

Memory module assemblies that are currently in use generally do not require cooling devices to dissipate heat. The electronic components and memory module assemblies currently available, which are operated on or below 66 MHz do not generate heat that requires a cooling device for dissipating the heat. However, as the industry progresses, the memory module assemblies, such SDRAM DIMM memory module assemblies are required to be operated on 100 MHz or above. For these up-to-date memory module assemblies, heat sinks will be required to remove heat generated thereby. However, since the memory module assemblies each have a little board area and are crowdedly mounted on a motherboard of a computer, how to mount the heat sink to the memory module assembly becomes an issue.

SUMMARY OF INVENTION

A memory module assembly in accordance with a preferred embodiment of the present invention comprises a printed circuit board having an heat-generating electronic component thereon, a heat sink and a clip for securing the heat sink onto the heat-generating electronic component. The heat sink comprises a base and a plurality of fins arranged on the base. The base defines a pair of cutouts in opposite sides thereof. The clip comprises a pressing portion and a pair of latching portions respectively extending from two ends of the pressing portion. Each latching portion comprises a latching leg and a retaining hook section formed at a lower end of the latching leg. The retaining hook sections engage with a bottom face of the printed circuit board and the pressing portion presses the base toward the heat-generating electronic component. The latching legs extend through an opening and a through hole in the printed circuit board, respectively. The opening is defined perpendicularly through a circumferential side of the printed circuit board. The through hole has a L-shaped configuration and does not extend through the circumferential side of the printed circuit board.

Other advantages and novel features will become more apparent from the following detailed description of preferred embodiments when taken in conjunction with the accompanying drawings, in which:

DETAILED DESCRIPTION

Figure 1:
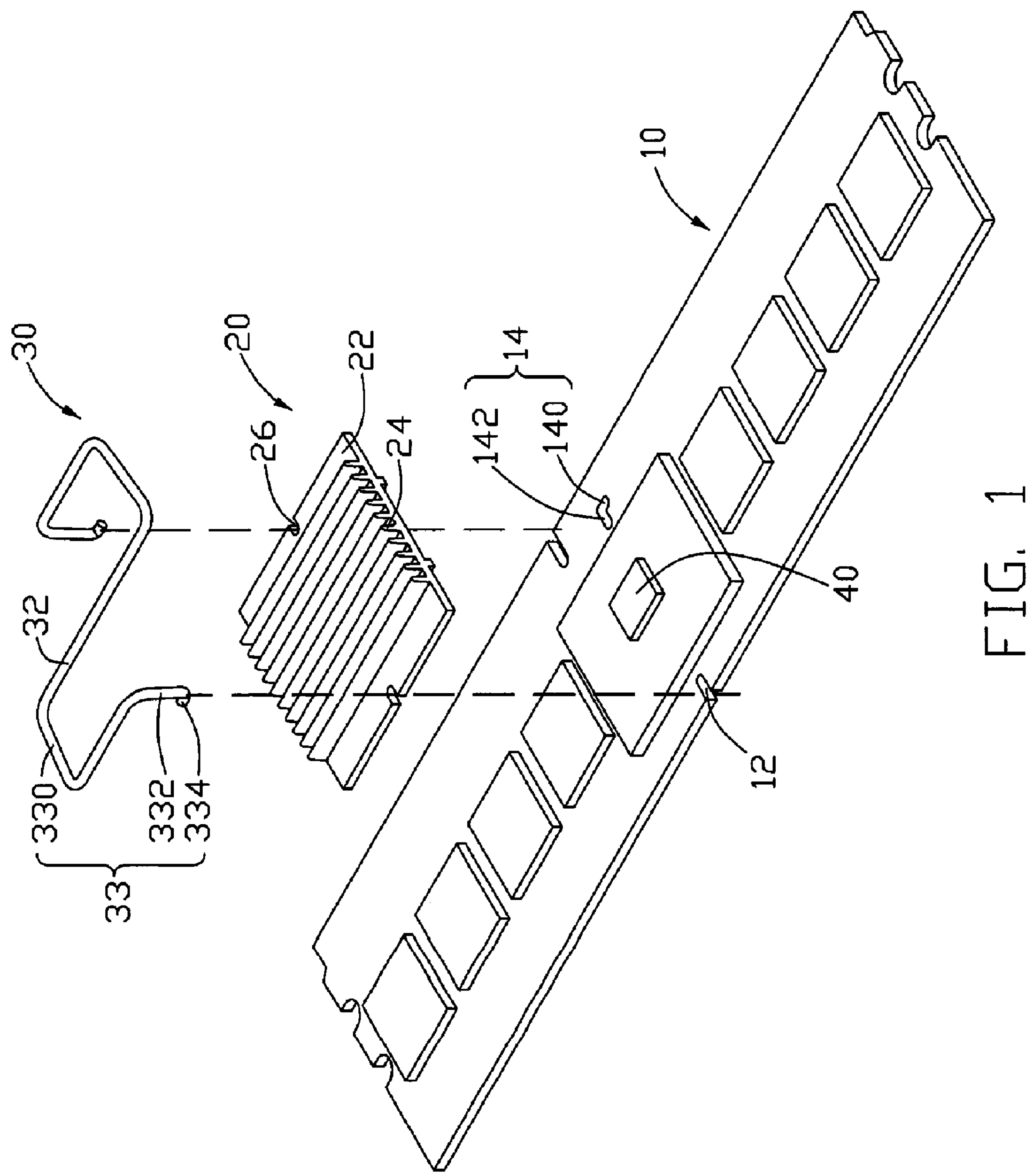
FIG. 1 is an isometric, exploded view of a memory module assembly in accordance with a preferred embodiment of the present invention.

Referring to FIGS. 1-4, a memory module assembly in accordance with a preferred embodiment of the present invention comprises a printed circuit board 10 with a heat-generating electronic component 40 mounted on a top surface thereof, a heat sink 20 and a clip 30 securing the heat sink 20 onto the printed circuit board 10. The printed circuit board 10 generally has a rectangular shape. The printed circuit board 10 defines an opening 12 in a front long side and a through hole 14 near a rear long side thereof. The opening 12 is extended in a direction perpendicular to the front long side of the printed circuit board 10 and through the front long side. The through hole 14 is L-shaped and comprises a first slot 140 extended in a direction parallel to the rear long side of the printed circuit board 10 and a second slot 142 communicated with the first slot 140 and extended in a direction perpendicular to the rear long side of the printed circuit board 10. The second slot 142 is arranged in line with the opening 12. The through hole 14 is located inside the rear long side of the printed circuit board 10 and does not extend therethrough.

The heat sink 20 comprises a base 22 for contacting the heat-generating electronic component 40 and a plurality of fins 24 arranged on an upper surface of the base 22. The base 22 defines a pair of cutouts 26 in opposite sides thereof, respectively corresponding to the opening 12 and the through hole 14 of the printed circuit board 10, for the clip 30 to extend therethrough.

The clip 30 is made by folding a metallic wire. The clip 30 comprises a horizontal elongated pressing portion 32 and a pair of latching portions 33 respectively extending from two opposite ends of the pressing portion 32 in opposite directions. Each latching portion 33 comprises a connecting section 330 extending perpendicularly and from an end of the pressing portion 32 and a latching leg 332 extending vertically downwardly from a distal end of the connecting section 330. The connecting section 330 has a L-shaped configuration and is slightly upwardly slantwise in comparison with the horizontal pressing portion 32 (particularly see FIG. 2 and FIG. 4). A retaining hook section 334 is formed at a distal end of each latching leg 332. A length of the retaining hook section 334 is shorter than that of the first slot 140 of the through hole 14. The retaining hook sections 334 extend along a direction parallel to the long sides of the printed circuit board 10. The retaining hook sections 334 extend oppositely from each other. The retaining hook sections 334 are used for engaging with a bottom surface of the printed circuit board 10 and the pressing portion 32 is used for pressing the heat sink 20 onto a top of the heat-generating electronic component 40 of the printed circuit board 10.

Figure 2:
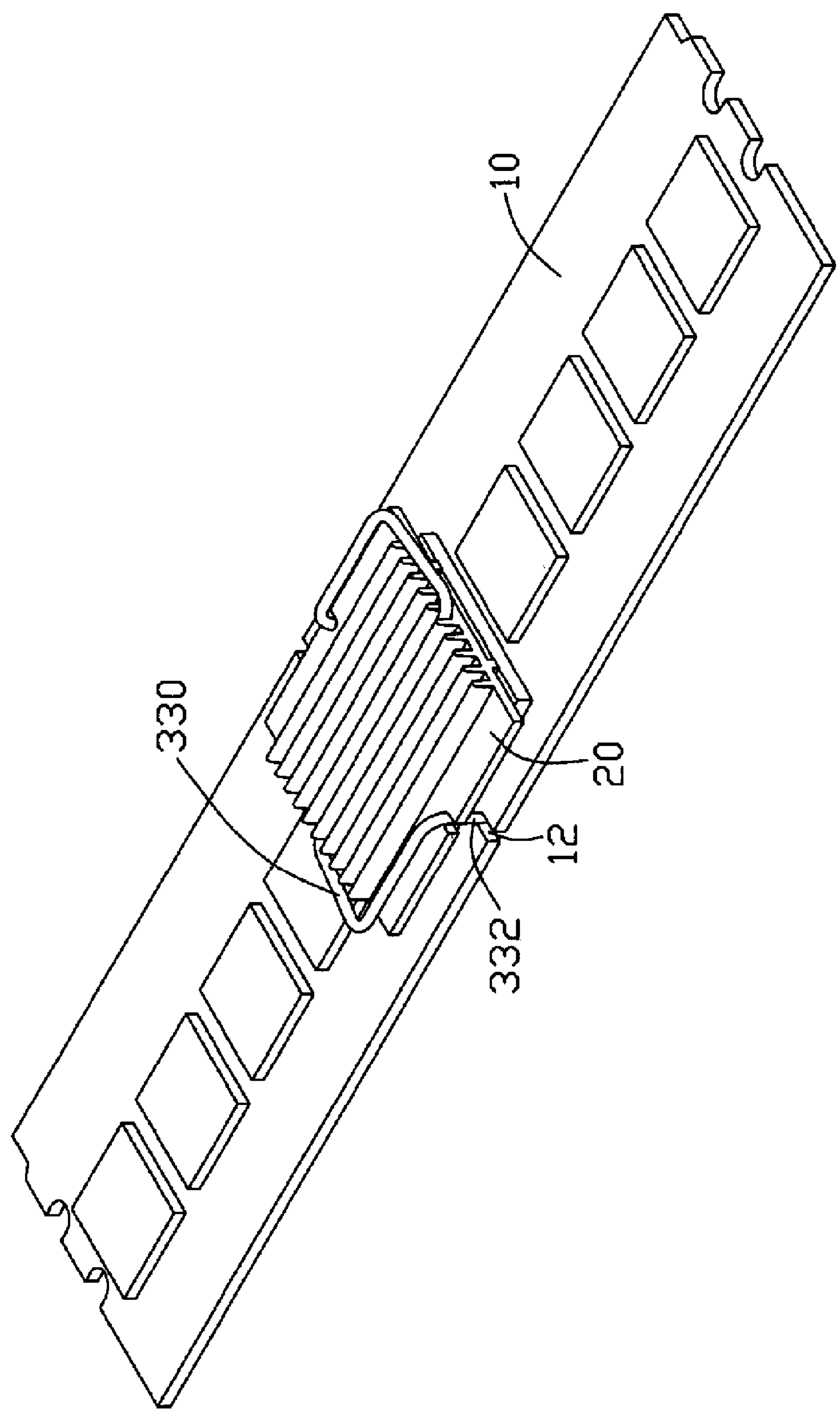
FIG. 2 is an assembled view of FIG. 1.
Figure 3:
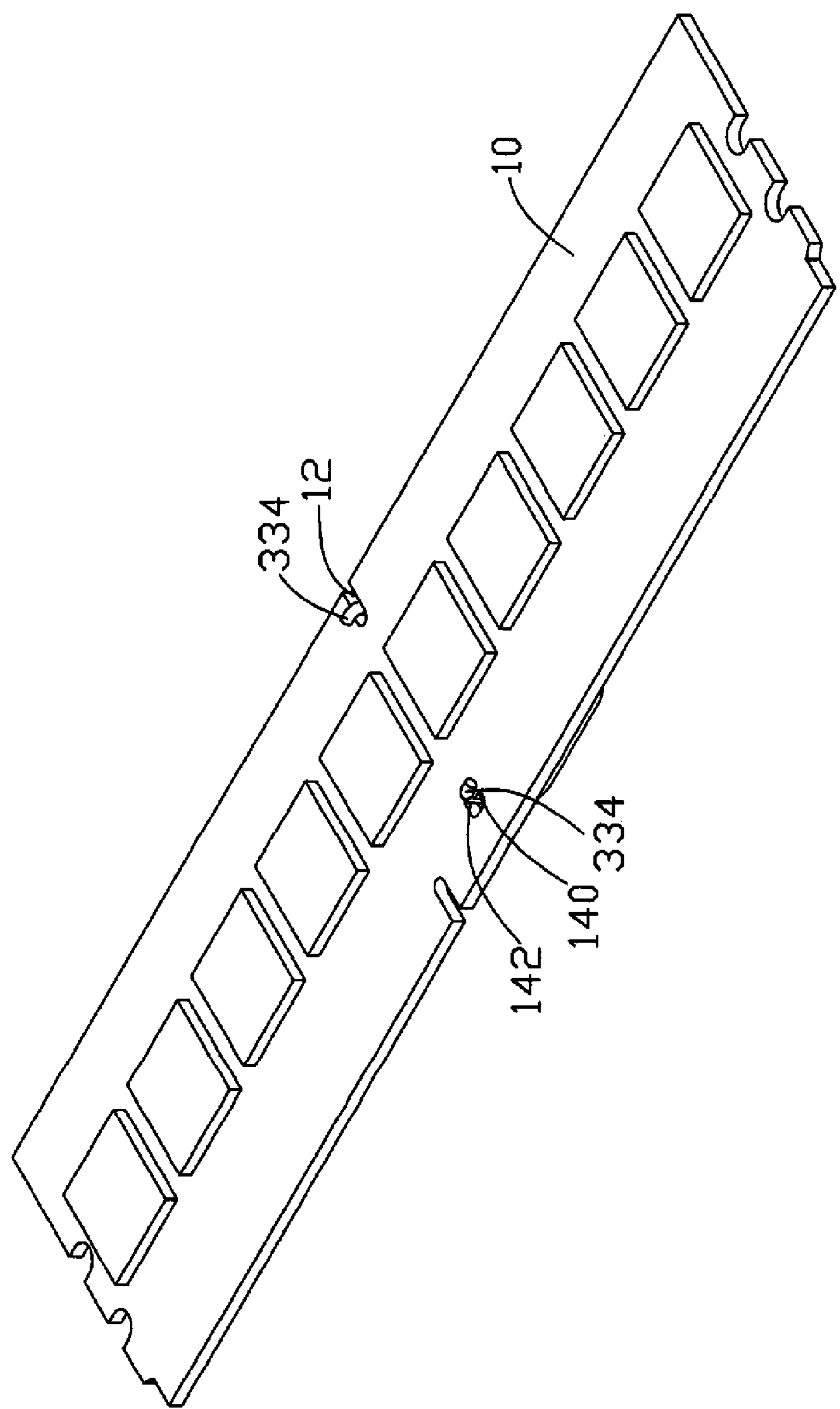
FIG. 3 is a view similar to FIG. 2, viewed from a bottom aspect.
Figure 4:
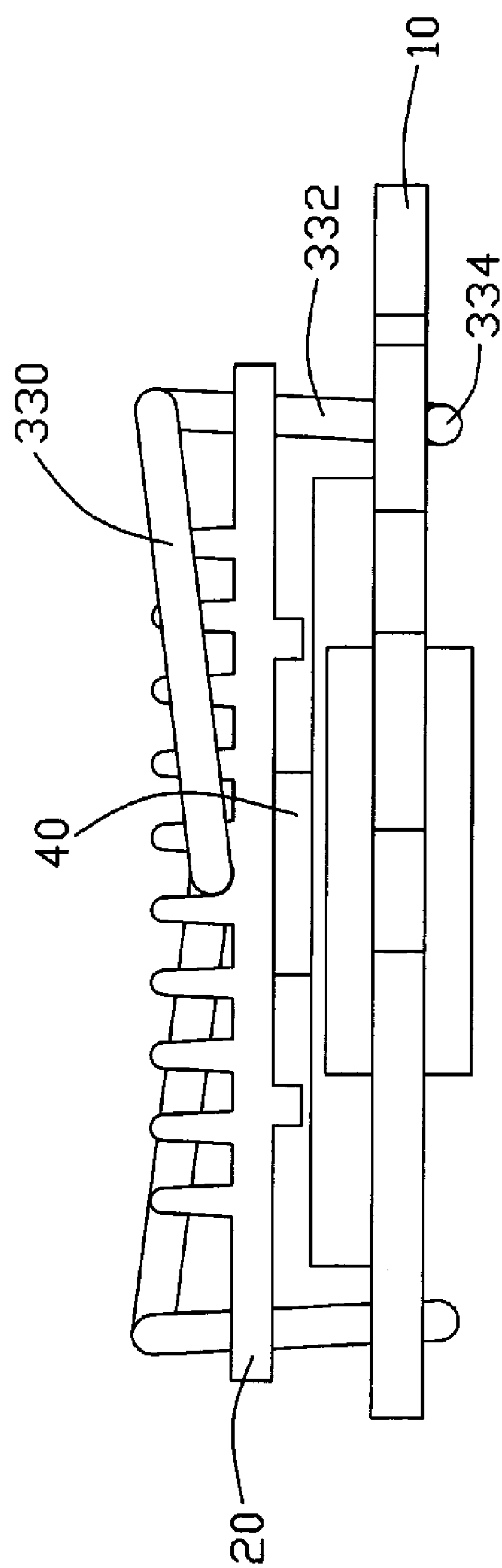
FIG. 4 is a view similar to FIG. 2, viewed from a lateral side aspect.

Referring to FIGS. 2-4, in attachment of the heat sink 20 to the printed circuit board 10, the heat sink 20 is placed on the top surface of the heat-generating electronic component 40. A corresponding one of the latching legs 332 is extended through a corresponding one of the cutouts 26 and the opening 12 to cause a corresponding one of the retaining hook sections 334 to rest on the bottom surface of the printed circuit board 10. The corresponding latching leg 332 is received in the corresponding cutout 26 of the heat sink 20 and the opening 12 of the printed circuit board 10. Thereafter, the other latching leg 332 is brought by a depressing force acting thereon to extend through the other cutout 26 and a portion of the first slot 140 just in rear of the second slot 142 of the through hole 14. The other retaining hook section 334 is positioned under the first slot 140. The other latching leg 332 is thereafter moved into the second slot 142. At this stage, the other retaining hook section 334 moves to the bottom surface of the printed circuit board 10. Finally, the depressing force acting on the other latching leg 332 is released to cause the corresponding and the other retaining hook sections 334 to tightly engage with the bottom surface of the printed circuit board 10. The pressing portion 32 is received in a center of the heat sink 20 to press on the top surface of the base 22. The connecting sections 330 are disposed at a periphery of the heat sink 20. The clip 30 secures the heat sink 20 and the printed circuit board 10 together. The heat sink 20 is thus pressed toward the top surface of the heat-generating electronic component 40 mounted on the printed circuit board 10, to have an intimate contact with the top surface of the heat-generating electronic component 40 for absorbing heat from the heat-generating electronic component 40.

It is believed that the present embodiments and their advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. A memory module assembly comprising:

a rectangular printed circuit board having top and bottom faces and two long sides and two short sides between the two long sides, one of the long sides defining an opening therein, the rectangular printed circuit board having a through hole near the other long side;

a heat-generating electronic component mounted on the top face of the printed circuit board;

a heat sink mounted on the electronic component; and a clip having a pressing portion pushing the heat sink toward the heat-generating electronic component and two latching portions extending from two opposite ends of the pressing portion, each latching portion comprising a retaining hook section;

wherein the latching portions are respectively extended through the opening and the through hole and the retaining hook sections engage with the bottom face of the printed circuit board, the retaining hook sections extending in a direction substantially parallel the long sides of the printed circuit board.

2. The memory module assembly as claimed in claim 1, wherein the clip is formed by folding a metallic wire.

3. The memory module assembly as claimed in claim 1, wherein the latching portion comprises a connecting section extending from a end of the pressing portion and a latching leg extending from a distal end of the connecting section, the retaining hook section being formed at a distal end of the latching leg.

4. The memory module assembly as claimed in claim 3, wherein each connecting section is slightly upwardly slantwise in respective to the pressing portion and is disposed at a periphery of the heat sink.

5. The memory module assembly as claimed in claim 1, wherein the retaining hook sections extend oppositely from each other.

6. The memory module assembly as claimed in claim 5, wherein the opening is substantially aligned with the through hole.

7. The memory module assembly as claimed in claim 5, wherein the through hole comprises a first slot extended parallel to the long sides of the printed circuit board and a second slot communicated with the first slot and extended perpendicular to the long sides of the printed circuit board.

8. The memory module assembly as claimed in claim 5, wherein the heat sink comprises a base contacting with the heat-generating electronic component and the latching portions are extended through opposite sides of the base.

9. The memory module assembly as claimed in claim 8, wherein the base defines a pair of cutouts in the opposite sides thereof, respectively, corresponding to the opening and the through hole of the printed circuit board.

10. A memory module assembly comprising:

a printed circuit board having an electronic heat-generating component mounted on a top face thereof;

a heat sink comprising a base and a plurality of fins arranged on the base; and a clip for securing the heat sink onto the heat-generating component mounted on the printed circuit board, the clip comprising a horizontal elongated pressing portion pressing the heat sink onto the electronic heat-generating component and a pair of latching portions respectively extending from two ends of the pressing portion, each latching portion comprising a latching leg extending from a corresponding end of the pressing portion and a retaining hook section formed at a distal end of the latching leg, the latching legs extending through the base and an opening and a through hole of the printed circuit board and the retaining hook sections engaging with a bottom face of the printed circuit board, the through hole being so defined that it does not extend through a circumferential side of the printed circuit board.

11. The memory module assembly as claimed in claim 10, wherein the base defines a pair of cutouts in opposite sides thereof, and the latching legs extend through the cutouts, respectively.

12. The memory module assembly as claimed in claim 11, wherein the opening of the printed circuit board extends perpendicularly through the circumferential side of the printed circuit board.

13. The memory module assembly as claimed in claim 12, wherein the cutouts are arranged corresponding to the opening and the through hole, respectively.

14. The memory module assembly as claimed in claim 10, wherein the clip is formed by folding a metallic wire.

15. The memory module assembly as claimed in claim 14, wherein each latching portion comprises a connecting section extending from the corresponding end of the pressing portion, the latching leg being extended from a distal end of the connecting section.

16. The memory module assembly as claimed in claim 15, wherein the connecting section has a L-shaped configuration and is disposed at a periphery of the heat sink.

17. A method for mounting a heat sink to a memory module by a wire-type clip, the memory module having a rectangular printed circuit board with two parallel long sides, a heat-generating electronic component on a top face of the printed circuit board, an opening and a through hole in the printed circuit board, the wire-type clip having a middle pressing portion, a pair of latching portions extending oppositely from opposite ends of the pressing portion, each latching portion comprising a vertically downwardly extending latching leg and a retaining hook section extending horizontally from a bottom end of the latching leg, the method comprising:

putting the heat sink on the electronic component;

putting the pressing portion of the clip on the heat sink;

extending a corresponding latching leg through the opening to reach a position wherein a corresponding retaining hook section is located below a bottom face of the printed circuit board;

extending the other latching leg through the through hole to reach a position wherein the other retaining hook section is below the through hole;

moving the other latching leg to reach a position wherein the other retaining hook section is below the bottom face of the printed circuit board;

releasing the other latching leg to cause the two retaining hook sections to tightly engage with the bottom face of the printed circuit board and the pressing portion to depress the heat sink so that the heat sink has an intimate contact with the heat-generating electronic component;

wherein the opening is perpendicularly extended through a corresponding long side of the printed circuit board, and the through hole is located near the other long side of the printed circuit board.

18. The method as claimed in claim 17, wherein the through hole has a L-shaped configuration with a first slot parallel to the other long side and a second slot perpendicular to the other long side.

19. The method as claimed in claim 18, wherein the retaining hook section moves from the position below the through hole to the position below the bottom surface of the printed circuit board by moving the other latching leg from the first slot to the second slot.

* * * * *